United States Patent

Baik et al.

[11] Patent Number: 5,679,164
[45] Date of Patent: Oct. 21, 1997

[54] AUXILIARY APPARATUS FOR GROWING MOCVD

[75] Inventors: Jong-Hyup Baik; Beon Lee, both of Daejeon, Rep. of Korea

[73] Assignee: Electronics and Telecommunications Research Institute, Daejeon, Rep. of Korea

[21] Appl. No.: 567,574

[22] Filed: Dec. 5, 1995

[30] Foreign Application Priority Data

Sep. 6, 1995 [KR] Rep. of Korea ............... 95-29218

[51] Int. Cl.$^6$ ............................................. H01L 21/00
[52] U.S. Cl. ................................... 118/715; 118/728
[58] Field of Search ............................. 118/715, 728, 118/729

[56] References Cited

U.S. PATENT DOCUMENTS

| | | | |
|---|---|---|---|
| 4,839,145 | 6/1989 | Gale et al. | 118/725 |
| 5,070,815 | 12/1991 | Kasai et al. | 118/725 |
| 5,336,324 | 8/1994 | Stall et al. | 118/719 |
| 5,456,945 | 10/1995 | McMillan et al. | 118/715 |

OTHER PUBLICATIONS

A Novel MOVPE Reactor with a Rotating Substrate; E. Woelk and H. Beneking; Journal of Crystal Growth 93 (1988); pp. 216–219.

A Parametric Investigation of GaAs Epitaxial Growth Uniformity in a High Speed, Rotating Disk MOCVD Reactor; G.S. Tompa et al; Journal of Crystal Growth 93(1988) pp. 220–227.

*Primary Examiner*—Felisa Garrett
*Attorney, Agent, or Firm*—Larson and Taylor

[57] ABSTRACT

The present invention relates in general to a metal-organic chemical vapor deposition (MOCVD) apparatus used to grow an epi layer, and more particularly to an auxiliary apparatus for growing MOCVD for uniformly growing an epi layer inside a reaction chamber. The auxiliary apparatus includes a molybdenum cylinder that is used to guide the source gas, an inner barrel located within and spaced from the cylinder, and an axially extending separation plate that divides the cylinder and inner barrel into two portions. A flange attaches the auxiliary apparatus to the reaction chamber.

7 Claims, 4 Drawing Sheets

AUXILIARY APPARATUS FOR GROWING MOCVD

TECHNICAL FIELD OF INVENTION

The present invention relates in general to the metal-organic chemical vapor deposition (MOCVD) apparatus, which is one of the epi growing apparatuses, and more particularly to an auxiliary apparatus for providing uniform growth of an epi layer of a semiconductor, such as GaAs or InP and related material by MOCVD method.

BACKGROUND OF THE INVENTION

The metal-organic chemical vapor deposition (MOCVD) apparatus of the epi growing apparatus widely used in the world, and the epi growing techniques used by the same, is a link in a chain of world techniques, and all matters found in epi growing are interesting subjects worldwide.

MOCVD apparatus is an important tool by which ultra-fine semiconductor structure products can be produced. Although it has fallen behind as compared with MBE techniques, the MOCVD method has been most widely used for the growth of advanced semiconductor products currently used in the world due to the several advantages of the MOCVD method.

The main interesting matters in MOCVD growing from the time when the MOCVD apparatus had been developed were the methods of uniformly adjusting the flow of the source gas flowing in the inner portion of the reaction chamber, which is a vessel for MOCVD growing.

The uniform gas flow is directly associated with the structure quality of the semiconductor and other grown epi layers.

Therefore, to obtain a good quality in the growing structure under several growing conditions the gas flow pattern in the growing apparatus should be a laminar flow.

However, the growth of the completed structure is not achieved because the uniformity of the grown structure is limited under such good contributing conditions.

Particularly, although in a vertical MOCVD reaction chamber the uniformity of the beginning growing structure is not desired in the growth of the fixed substrate, a thickness uniformity has been achieved by ±3.5 percentage of the growing structure grown on the substrate when the substrate is rapidly rotated at about 1400 rpm.

However, so far the improved matters is associated with the apparatus are no longer practiced, but in the case of the vertical MOCVD apparatus, it is a real challenge to change the growing conditions to enhance the thickness uniformity.

However, changing the growing conditions has somewhat improved the thickness uniformity of the growing structure, and thus the time spending to again establish the growing condition is incurred.

SUMMARY OF THE INVENTION

It is an object of the present invention to solve the problem as mentioned hereinabove, and specifically to provide the auxiliary apparatus for growing MOCVD to enhance the growth uniformity under the condition without changing the growth rate and the compositions of the grown structure.

The feature of the present invention to accomplish the objective mentioned hereinabove is characterized in that the metal organic chemical vapor deposition apparatus of the epi growing apparatus used in the fabrication of semiconductor products comprises means for guiding the source gas supplying the reaction chamber of said metal organic chemical vapor deposition apparatus to uniformly deposit on the substrate surface, and means for attaching this means to the reaction chamber.

The guiding means according to the present invention comprises the cylindrical shape of an outer barrel having any length, and an inner barrel located inside of the outer barrel.

The guiding means in accordance with the present invention is also somewhat distant from the end of the outer barrel to the substrate to get uniform deposition of source gas to the substrate in the reaction chamber.

The distance between the end of the guiding means and the substrate is about 2 inches.

The fixing means in accordance with the present invention comprises a flange having several bolt holes to connect the reaction chamber with bolts and the fixing ring to enter into respectively both said separation plate and said reaction chamber fitted in a step well wherein said step well is formed on the separation plate.

Variable growing conditions exist during the reactions in the reaction chamber when growing the structure of GaAs, InP and related compound semiconductor products having good quality by using metal-organic chemical vapor deposition (MOCVD) apparatus.

Then, the design of the reaction chamber is important to have uniformity in the flow of the gas and more specifically the distance from the location of the gas where first injected into the reaction chamber to the substrate being grown is an initial parameter.

If an initial parameter thereof is eliminated, the reaction chamber can always show uniform gas flow pattern without any concerns of any other parameters, i.e., the amount of gas flow, the pressure of the reaction chamber, the temperature of the reaction chamber, thereby easily obtaining a good quality of the semiconductor structure.

Although the present invention is formed with the substrate suitable to MOCVD apparatus for the group III–V semiconductor elements, it is also applicable to the MOCVD apparatus to grow other group III–VI materials or superconductors.

BRIEF DESCRIPTIONS OF THE DRAWINGS

Further features and advantages will become more apparent from the following detailed description of the preferred embodiment of the invention, as illustrated in the accompanying drawings. Corresponding numerals and symbols in the different figures refer to corresponding parts unless otherwise indicated, and in which.

DETAILED DESCRIPTION OF THE INVENTION

Figure 1:
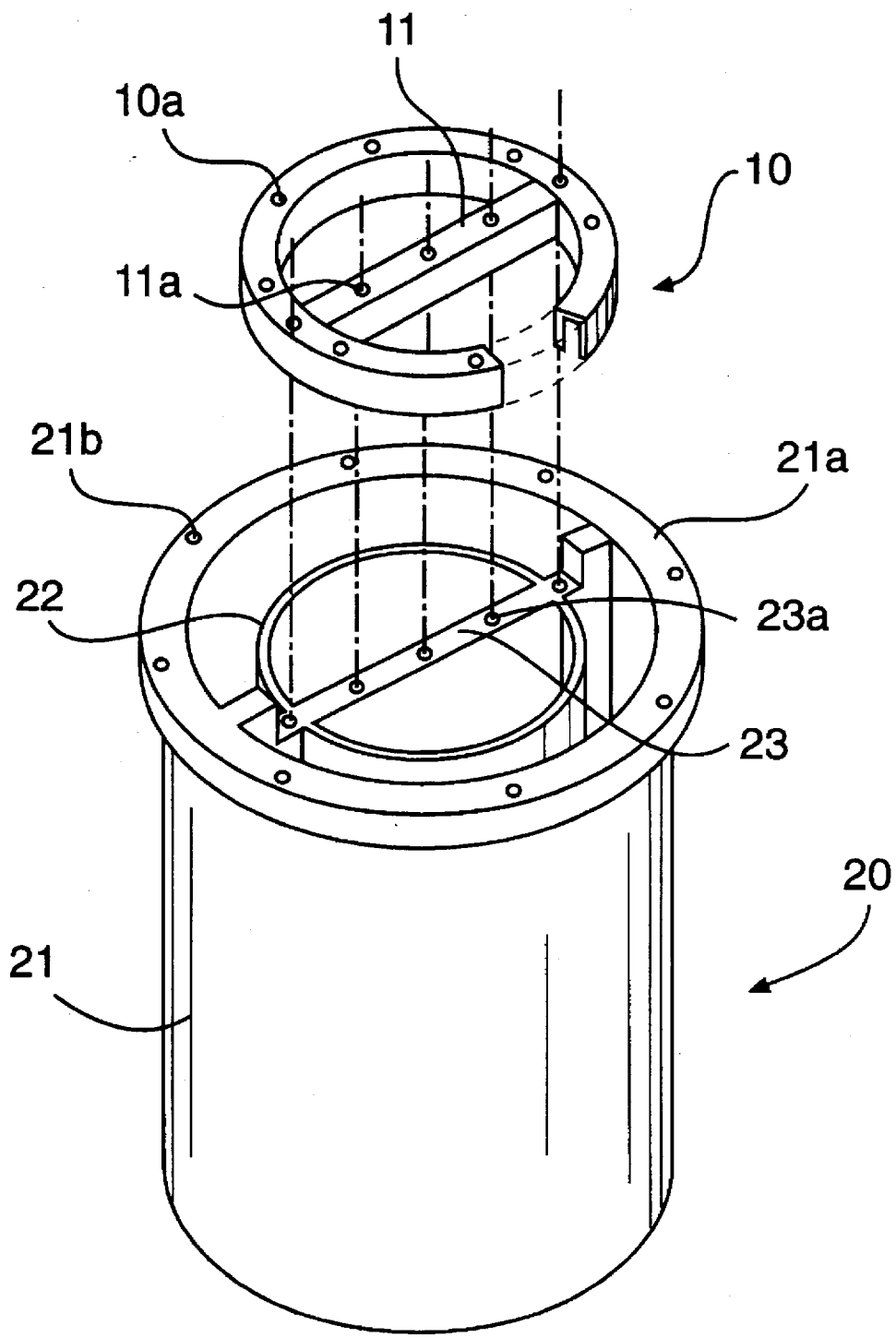
FIG. 1 is a fragmentary perspective view of the cylinder and fixing ring illustrating an embodiment according to the present invention.

FIG. 1 is a fragmentary perspective view illustrating the connected relationship of a cylinder 20 and a fixing ring 10 according to an embodiment of the present invention.

Figure 2A:
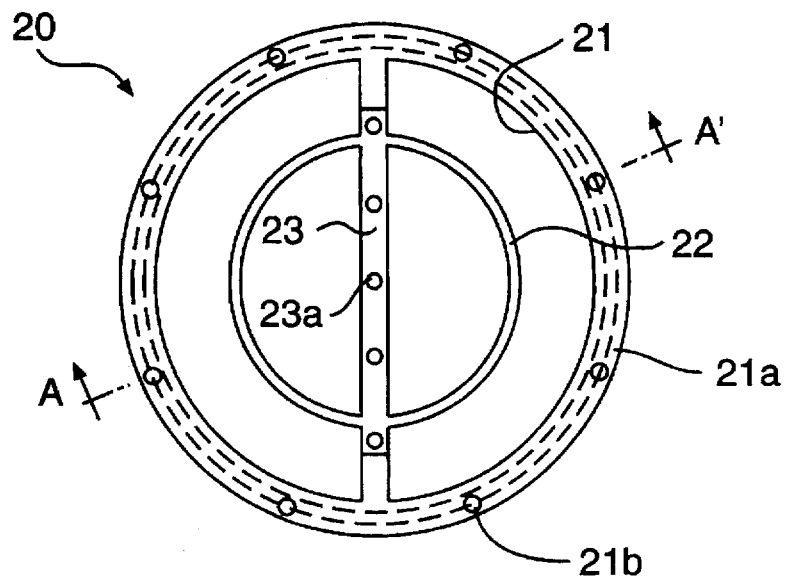
FIG. 2A is a top plan view illustrating a cylinder according to the present invention.
Figure 2B:
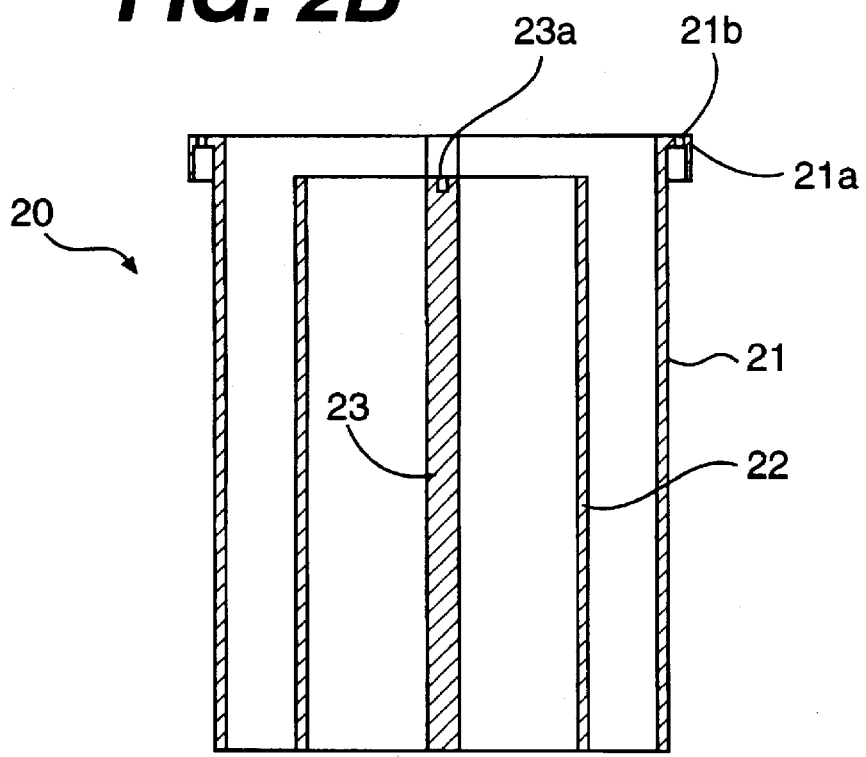
FIG. 2B is a cross-sectional view illustrating a cylinder taken along line A–A' in FIG. 2A.
Figure 3A:
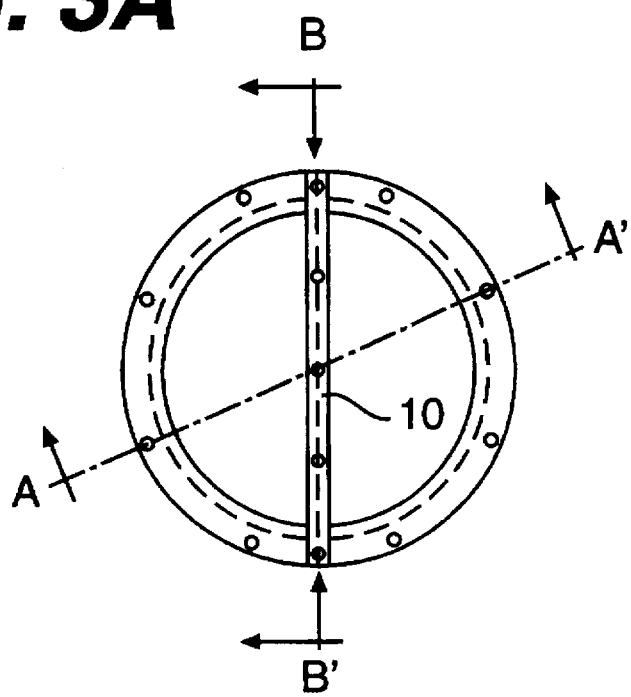
FIG. 3A is a top plan view illustrating a fixing ring according to the present invention.
Figure 3B:
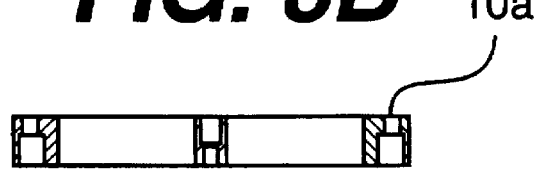
FIG. 3B is a cross-sectional view illustrating a fixing ring taken along line A–A' in FIG. 3A.
Figure 3C:
FIG. 3C is a cross-sectional view illustrating a fixing ring taken along line B–B' in FIG. 3B.

FIG. 2A and 2B respectively illustrate a top plan view of the structure of a cylinder 20, and is a cross-sectional view of a cylinder taken along line A–A' in FIG. 2A, and FIG. 3A, 3B and 3C respectively illustrate a top plan view of a fixing ring 10, a cross-sectional view of fixing ring 10 taken along line A–A' in FIG. 3A, and a cross-sectional view of a fixing ring taken along line B–B' in FIG. 3B.

The cylinder 20 comprises the outer barrel 21 and the inner barrel 22 having a chimney structure, and the separation plate 23 dividing the chimney in the vertical direction.

A flange 21A is formed on the upper of the outer barrel 21 for attaching cylinder 20 to the reaction chamber 100 together with the fixing ring 10.

The upper end of the inner barrel 22 is lowered by any height relative to the outer barrel 21 (this depth is the same as the thickness of the fixing ring 10), and the separation plate 23 forms the step well 23a for as much as the height between the outer barrel 21 and the inner barrel 22.

FIG. 3 illustrates the structure of the fixing ring 10, having a diameter so as to be able to be located between the outer barrel 21 and the inner barrel 22 of cylinder 20.

Several bolt holes 10a have respectively the corresponding diameter as formed on the ring.

Figure 4:
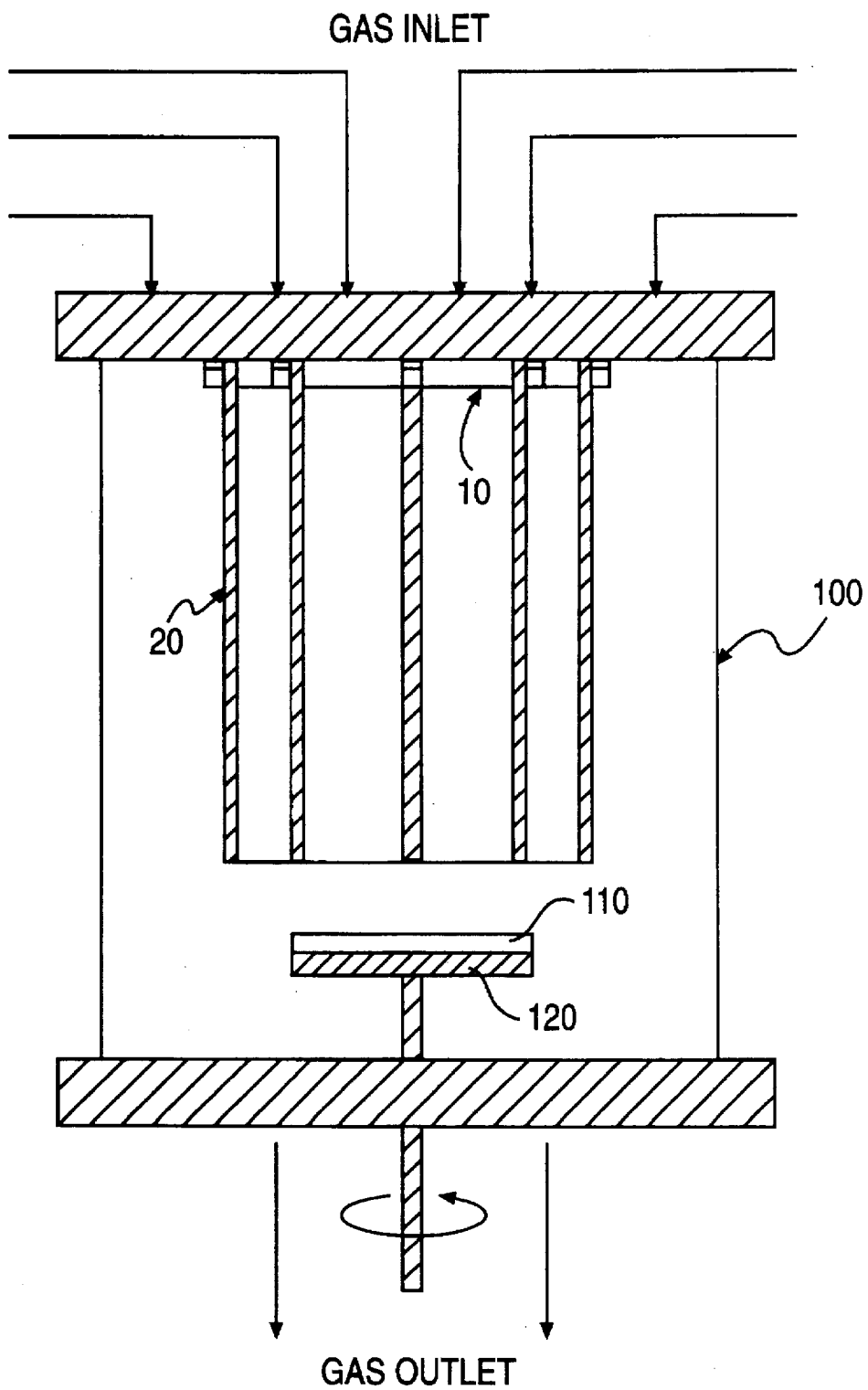
FIG. 4 is a cross-sectional view illustrating the installation to the assembly in the reaction chamber according to the present invention.

FIG. 4 illustrates the installation of the assembly attached to the reaction chamber according to the present invention, including the structure as mentioned hereinabove.

The fixing ring 10 has the structure for correctly assembling the step well 23a and the inner barrel 22 on the upper part of the cylinder 20.

The fixing ring 10 is directly attached to the separation plate 23 by the several bolt holes 10a formed on the fixing ring 10 located between the outer barrel 21 and the inner barrel 22, and thus attached to the reaction chamber 100 with a bolt.

Therefore, the flange 21a of the cylinder and the fixing ring 10 have the structure to chain-fasten reaction chamber 100 with a bolt.

The structure as mentioned above according to the present invention is fixed at the direction perpendicular to the surface of the substrate 110 to grow in the reaction chamber 100, and one end thereof is formed to have a length so as to be able to be close to the sample 110.

The material of the cylinder 20 and the fixing ring 10 is made from molybdenum which has the characteristics that it is not easily contaminated in the high temperatures.

The reference number 120 denotes the rotating sample holder.

The advantageous effect of having the structure as mentioned above according to the present invention is as follows.

When the source gas is injected into the reaction chamber 100 to grow the epitaxial layer on the substrate 110, then the amount of gas is adjusted because the amount of gas injected into the center and the outside portions is independently divided by the outer barrel 21, and the inner barrel 22 is separated with a separation plate 23.

The divided and flowing source gas is guided to the lower end along the cylinder 20, and then the growth is begun by contacting the substrate 110 as soon as the gas departs from the cylinder.

Therefore, the possibility of turbulence of the gas flow is reduced, thereby obtaining the uniform growing structure of the semiconductor.

The uniform grown structure of the semiconductor is obtained if the distance between the lower end of the cylinder 20 and the substrate is appropriately adjusted.

Desirably, the distance between the lower end of the cylinder and the substrate is within 2 inches.

In view of the effect as mentioned hereinabove, the MOCVD apparatus according to the present invention can accomplish the uniform gas flow effectively while maintaining the growing condition adjusted optimally using as it is.

As a result of making an examination of the epi growth by installing the cylinder, the thickness uniformity of the epi layer grown on the 2 in. substrate is lowered to +/−2.5 percent which is better than +/−3.5 percent obtained without cylinder.

As seen from the above description, the present invention has the advantageous effect of growing a highly uniform epi layer by maintaining the uniform flow of the gas in the reaction chamber by using the cylinder.

While the foregoing discloses the preferred embodiment of the invention, it is to be understood that many changes in the details may be made as a matter of engineering choice without deviating from the spirit and scope of the invention as defined by the appended claims. Moreover, those skilled in the art may find that it is not necessary to adopt all of the various advantages and features of the present disclosure into other semiconductor substrates in order to realize the individual advantages disclosed herein.

What is claimed is:

1. In a metal organic chemical vapor deposition apparatus including a reaction chamber to grow an epi layer with an epi growing apparatus used in the fabrication of a semiconductor product, the improvement comprising:

means for guiding a source gas to deposit uniformly on a substrate surface in the reaction chamber of said metal organic chemical vapor deposition apparatus, and means for fixing said guiding means in the reaction chamber.

2. The metal organic chemical vapor deposition apparatus as claimed in claim 1, wherein said guiding means includes a cylinder; and wherein said cylinder and said fixing means are made from molybdenum.

3. The metal organic chemical vapor deposition apparatus as claimed in claim 1, wherein said fixing means attaches said guiding means at a proximal end of said guiding means, said guiding means having an unattached distal end and comprising a cylindrical outer barrel which defines an axial direction, an inner barrel located within and spaced from said outer barrel, and an axially extending separation plate dividing said outer and inner barrel into two portions.

4. The metal organic chemical vapor deposition apparatus as claimed in claim 3, wherein the distance between the distal end of said guiding means and said substrate is about 2 inches.

5. The metal organic chemical vapor deposition apparatus as claimed in claim 3 wherein said fixing means comprises a flange having a plurality of bolt holes, said flange being attachable to the reaction chamber with bolts through said bolt holes, and a fixing ring to enter into respectively both said separation plate and said reaction chamber fitted in a step well in which said step well is formed on said separation plate.

6. The metal organic chemical vapor deposition apparatus as claimed in claim 5, wherein said fixing ring has a diameter so as to be able to be mounted between said inner barrel and said outside barrel and includes a plurality of bolt holes to attach to the reaction chamber.

7. The metal organic chemical vapor deposition apparatus as claimed in claim 1, wherein the guiding means is independently separated through both the lower end of the guiding means to deposit uniformly an epi layer with the source gas on said substrate.

* * * * *